United States Patent [19]
Wu et al.

[11] Patent Number: 5,925,918
[45] Date of Patent: Jul. 20, 1999

[54] GATE STACK WITH IMPROVED SIDEWALL INTEGRITY

[75] Inventors: Zhiqiang Wu, Meridian; Pai-Hung Pan, Boise, both of Id.

[73] Assignee: Micron, Technology, Inc., Biose, Id.

[21] Appl. No.: 08/902,808

[22] Filed: Jul. 30, 1997

[51] Int. Cl.⁶ .................................................. H01L 29/78
[52] U.S. Cl. ......................... 257/413; 257/915; 438/595; 438/653
[58] Field of Search ................... 257/412, 413, 257/915; 438/595, 653

[56] References Cited

U.S. PATENT DOCUMENTS

| | | | |
|---|---|---|---|
| 4,855,798 | 8/1989 | Imamura et al. | 257/915 |
| 5,032,530 | 7/1991 | Lowrey et al. | 437/34 |
| 5,087,584 | 2/1992 | Wada et al. | 437/43 |
| 5,103,272 | 4/1992 | Nishiyama | 257/770 |
| 5,146,291 | 9/1992 | Watabe et al. | 357/23.4 |
| 5,175,606 | 12/1992 | Tsai et al. | 257/320 |
| 5,235,204 | 8/1993 | Tsai | 257/408 |
| 5,268,330 | 12/1993 | Givens et al. | 437/195 |
| 5,272,367 | 12/1993 | Dennison et al. | 257/306 |
| 5,382,551 | 1/1995 | Thakur et al. | 437/247 |
| 5,422,291 | 6/1995 | Clementi et al. | 437/43 |
| 5,425,392 | 6/1995 | Thakur et al. | 437/173 |
| 5,438,016 | 8/1995 | Figura et al. | 437/67 |
| 5,439,838 | 8/1995 | Yang | 437/43 |
| 5,459,345 | 10/1995 | Okudaira et al. | 257/310 |
| 5,468,665 | 11/1995 | Lee et al. | 437/44 |
| 5,538,906 | 7/1996 | Aoki | 437/29 |
| 5,545,578 | 8/1996 | Park et al. | 437/44 |
| 5,583,368 | 12/1996 | Kenney | 257/621 |
| 5,597,756 | 1/1997 | Fazan et al. | 437/52 |
| 5,608,249 | 3/1997 | Gonzalez | 257/306 |
| 5,624,865 | 4/1997 | Schuegraf et al. | 438/396 |
| 5,668,394 | 9/1997 | Lur et al. | 257/412 |
| 5,681,768 | 10/1997 | Smayling et al. | 437/41 |
| 5,739,066 | 4/1998 | Pan | 438/595 |

OTHER PUBLICATIONS

Beyers, R., "Thermodynamic Considerations in Refractory Metal Silicon–Oxygen Systems", *J. Appl. Phys.*, 56, 147–152, (Jul. 1984).

Kasai, K., et al., "W/WNx/Poly–Si Gate Technology for Future High Speed Deep Submicron CMOS LSIs", *IEDM 1994*, 497–500, (1994).

Lee, D.H., et al., "Gate Oxide Integrity (GOI) of MOS transistors with W/TiN stacked gate", *1996 Symposium on VLSI Technology Digest of Technical Papers*, Semiconductor R&D Center, Samsung Electronics Co., Ltd, 208–209, (1996).

*Primary Examiner*—David B. Hardy
*Attorney, Agent, or Firm*—Schwegman, Lundberg, Woessner & Kluth, P.A.

[57] ABSTRACT

A process of manufacturing a gate stack is disclosed whereby the integrity of both the gate sidewalls and the substrate surface is maintained. Nitride spacers are constructed on the sidewalls of a gate which has been etched only to the top of the polysilicon layer. This allows more of the polysilicon sidewall to be exposed during subsequent reoxidation while at the same time minimizing effects such as bird's beak resulting during reoxidation. After the nitride spacers are constructed the subsequent etch is performed in two steps in order to minimize degradation of the substrate surface in underlying active regions.

9 Claims, 1 Drawing Sheet

GATE STACK WITH IMPROVED SIDEWALL INTEGRITY

FIELD OF THE INVENTION

The present invention relates in general to fabricating semiconductor devices, and particularly to fabricating well-formed gate stacks.

BACKGROUND OF THE INVENTION

A gate in a semiconductor device acts as a capacitor, separating source/drain terminals. Controlling the charge on the gate controls the current flow between the source/drain regions. The conventional method of constructing a gate follows the general steps of: defining active device regions on a silicon substrate, growing a gate oxide on the substrate, depositing a layer of doped polysilicon on the gate oxide, and then depositing a conductive layer (generally a refractory metal or metal silicide) on the polysilicon. Gates are then defined using a photolithographic mask and etch. In conventional processing the gate oxide layer acts as an etch stop in the unexposed portions of the mask. Etching creates gate stacks by selectively removing the material in the unexposed areas. This process exposes a cross section of the device layers on the side walls of each gate stack. Source/drain regions are then implanted into the active regions on either side of the gate stack which are covered by the remaining thin gate oxide. A reoxidation step, referred to as poly reoxidation, follows to replace the screen oxide which is stripped off after source/drain implant. During poly reoxidation a new oxide is grown over the source/drain regions and on the sidewalls of the gate. During the reoxidation step the quality of the conductive layer and the profile of the gate stack may, however, be compromised. This results from sidewall oxidation forming a bird's beak under the polysilicon edge.

One method of preventing gate stack degradation is to form a protective oxidation barrier on the side walls of the gate stack. While this method of preventing gate stack degradation protects the metal layers of the gate stack, in conventional processing the gate oxide left over from the gate etch is relied upon to serve as an etch stop for the nitride spacer dry etch. Overetching of the gate oxide layer is therefore a potential problem. It increases the risk, especially for a thin gate oxide process, of compromising the quality of the silicon surface in underlying active regions, such as source/drain regions. Another disability of this method is that, because the nitride spacers overlie the entire sidewall surface of the gate, the source/drain reoxidation has to depend upon the oxidant to diffuse through the gate oxide layer beneath the gate and nitride spacers. As a result the desired oxidation of the polysilicon gate corner may be retarded. One partial solution was to use $H_2SO_4$ boiling to undercut the TiN (see D. H. Lee, K. H. Yeom, M. H. Cho, N. S. Kang and T. E. Shim, *Gate Oxide Integrity (GOI) of MOS transistors with WITIN stacked gate*, pages 208–209, 1996 *Symposium on VLSI Technology Digest of Technical Papers*). Lee's approach was to prevent direct contact between the gate electrode with the patterned edge by undercutting the TiN.

Device dimensions continue to shrink for reasons such as improved device performance and increased circuit density. Smaller dimensions require thinner layers. As one example, current 4-megabit dynamic random access memories (DRAMs) typically use gate oxide layers having a thickness within a range of 200 to 250Å for both memory array and peripheral transistors. For 16-megabit DRAMs, this figure is expected to fall to 150 to 200Å; and for 64-megabit and 256-megabit DRAMs, the thickness is expected to fall still further. For electrically-programmable memories such as electrically-erasable programmable read-only memories (EEPROMs) and flash memories, even thinner gate oxide layers are required to facilitate Fowler-Nordheim tunneling (universally used as the erase mechanism and often as the write mechanism). For the current generation of 4-megabit flash memories, 110Å-thick gate oxide layers are the norm. For future generations of more dense flash memories, gate oxide layers are expected to drop to the 80 to 90Å range. As gate oxide layers become thinner, it becomes increasingly important that such layers be defect free in order to eliminate leakage. Conventional gate etching uses the gate oxide layer as an etch stop. The increasingly thin gate oxide layer requires increased selectivity in the gate etch step in order to minimize the risk of compromising the quality of the gate oxide. A defect-free, very thin, high-quality oxide without contamination is essential for proper device operation. As a result, conventional processes experience, for example, higher production costs due to higher device failures and smaller process volumes.

SUMMARY OF THE INVENTION

The present invention teaches a process of fabricating a semiconductor device which preserves the integrity of the gate stack materials. According to one embodiment, a method of fabricating a gate on a semiconductor device is described. The method comprises forming a plurality of gates having sidewalls, using a polysilicon layer as the etch stop. A first oxidation barrier is formed on the exposed sidewalls of the plurality of gates. The sidewalls are extended by performing a dry etch, using the gate oxide layer as the etch stop. Source/drain regions are formed on either side of the gates and oxide is grown over the source/drain regions and the sidewalls of the plurality of gates. Optionally, a second oxidation barrier is formed on the sidewalls of the plurality of gates.

According to another embodiment, the step of forming a first oxidation barrier comprises forming nitride spacers, while in another embodiment the step of forming a first oxidation barrier comprises forming oxide spacers. In a further embodiment step of forming a second oxidation barrier comprises forming nitride spacers.

In another embodiment, a semiconductor device is provided. The semiconductor device comprises a plurality of gates on a gate oxide layer which has been grown on a silicon substrate. Each of the plurality of gates comprises a polysilicon layer adjacent to the gate oxide layer, a conductive layer adjacent to the polysilicon layer, and a first oxidation barrier on each of the gates' sidewalls, wherein the oxidation barrier covers the exposed sidewall of the conductive layer and a portion of the exposed sidewall of the polysilicon.

In a further embodiment the first oxidation barrier comprises nitride. Yet another embodiment describes a second oxidation barrier covering the entire surface of the gates' sidewalls. In one embodiment the second oxidation barrier comprises nitride.

Still another embodiment describes a method of forming a structure for controlling current flow between source and drain regions. The method comprises the steps of forming active regions in a semiconductor substrate, forming a gate oxide layer over the semiconductor substrate, forming an insulating layer over the gate oxide layer, forming a conductive layer over the insulating layer, forming sidewalls on a plurality of gates by etching, using the insulating layer as the etch stop, forming a first oxidation barrier on the sidewalls, and extending the sidewalls of the plurality of gates by etching, using the gate oxide layer as the final etch stop.

In another embodiment the method further comprises the step of forming a second oxidation barrier on the sidewalls of the plurality of gates. In yet another embodiment the first oxidation barrier is nitride. According to another embodiment the second oxidation barrier is nitride.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

A semiconductor device comprises layers of materials with different conductive properties. The term "gate stack" refers to the layers of materials which comprise a gate on a semiconductor device. Device features are then formed through a series of etchings and depositions or different materials.

Figure 1:
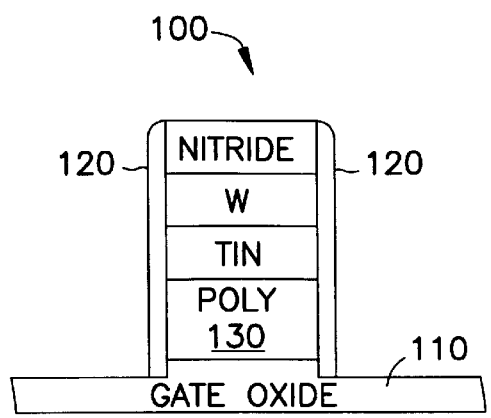
FIG. 1 is a cross-sectional view of a portion of an in-process semiconductor wafer following a conventional nitride spacer etch of the thin nitride layer, using the gate oxide layer as the etch stop.

FIG. 1 is a cross-sectional view of a portion of an in-process semiconductor wafer following conventional processing. In the conventional process, the oxide 110 remaining from the gate etch is used as the etch stop for the dry etch which forms the nitride spacers 120. In conventional processing a nitride dry etch is performed on the oxidation barrier using gate oxide layer 110 as the etch stop. The relatively low selectivity of a nitride dry etch increases the risk of overetching, reducing oxide layer 110 and compromising silicon surface quality.

Figure 2:
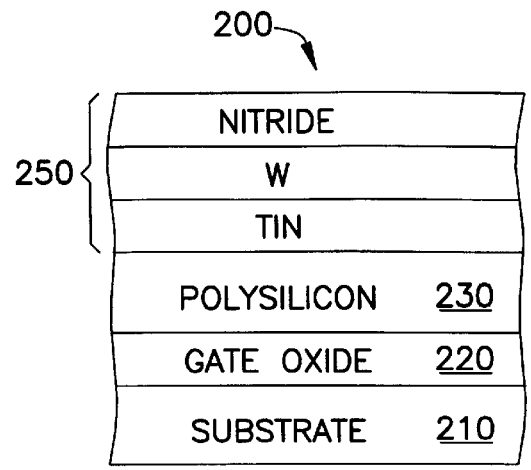
FIG. 2 is a cross-sectional view of a portion of an in-process semiconductor wafer prior to any etching.

FIGS. 2–5 show a portion of a semi-conductor device in various stages of processing according to one embodiment of the present invention. FIG. 2 shows a cross-section of a portion of a semiconductor wafer 200 after the initial layers are manufactured in the following, or a similar, manner. First, a thin gate oxide 220 is grown on a semiconductor wafer substrate 210. Next a layer of doped polysilicon 230 is deposited on the gate oxide 220. A film 250 containing at least a layer of conductive material is then deposited on the polysilicon layer 230. In the example shown in the figures the film 250 comprises layers of titanium nitride, tungsten, and nitride. Those skilled in the art will recognize that the materials mentioned are illustrative and not intended to limit the scope of the invention to a particular composition.

Figure 3:
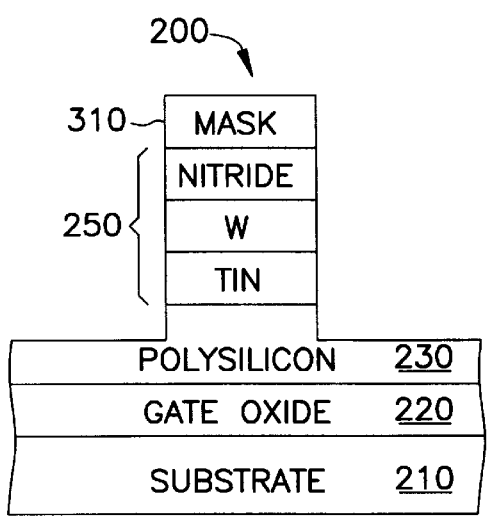
FIG. 3 is a cross-sectional view of the portion of an in-process semiconductor wafer depicted in FIG. 2 following gate line masking and a subsequent dry etch of the exposed silicon nitride, using the polysilicon layer as the etch stop.

The next step is to mask the device 200 to form a gate line, and then dry etch the device, using the polysilicon layer 230 as the etch stop. FIG. 3 is a cross-sectional view of the portion of an in-process semiconductor wafer depicted in FIG. 2 following gate line masking and a subsequent dry etch of the exposed silicon nitride, using the polysilicon layer 230 as the etch stop. Stopping in the polysilicon layer 230 provides two primary benefits over conventional processing. First, it avoids any potential degradation of the underlying gate oxide layer 220. Second, it preserves a portion of the polysilicon layer 230 for later exposure during poly reoxidation, allowing for a more efficient oxidation of the polysilicon gate corner.

Once the gates have been constructed source/drain regions are formed on either side of the gates. Those skilled in the art will recognize that the step of forming source/drain regions may be performed before or after forming an oxidation barrier or further etching.

Figure 4:
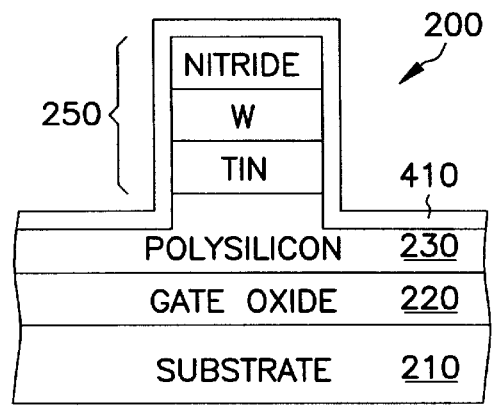
FIG. 4 is a cross-sectional view of the portion of an in-process semiconductor wafer depicted in FIG. 3 following deposition of a thin nitride layer over the surface of the device.

FIG. 4 is a cross-sectional view of the portion of an in-process semiconductor wafer depicted in FIG. 3. After removing the mask material 310, an oxidation barrier is formed. In one embodiment, a thin layer of nitride 410 is deposited on the entire surface of the wafer 200, including the sidewalls of the gate stack 420. Those skilled in the art will recognize that other materials, such as oxynitride, can be used as the oxidation barrier without exceeding the scope and spirit of the present invention. The oxidation barrier protects the conductive layer from re-oxidizing, which could otherwise create problems for the gate profile.

Next, the gate line is formed by a two-step etch. First, a nitride dry etch clears the nitride 410, and then a polysilicon dry etch removes the polysilicon 230. This two-step etch is more effective than conventional procedures.

Figure 5:
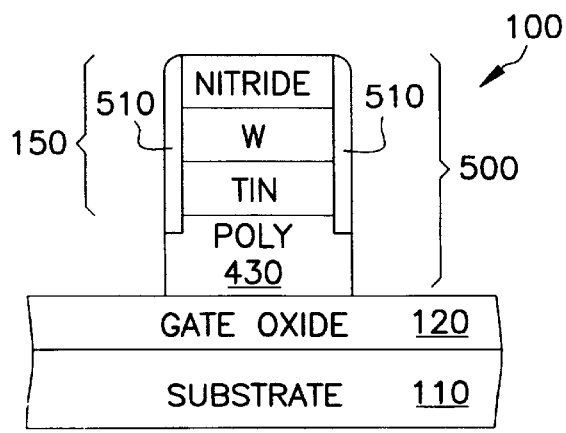
FIG. 5 is a cross-sectional view of the portion of an in-process semiconductor wafer depicted in FIG. 4, wherein a gate line is formed following a two-step dry etch, the first step comprising a nitride dry etch to clear the thin nitride layer and the second step comprising a polysilicon dry etch to remove the exposed polysilicon.

The result of the two-step etch, according to one embodiment of the present invention as shown in FIG. 5, is a gate stack 500 with nitride spacers 510 protecting the conductive layer 150. FIG. 5 is a cross-sectional view of the portion of an in-process semiconductor wafer depicted in FIG. 4, wherein a gate line is formed following a two-step dry etch, the first step comprising a nitride dry etch to clear the thin nitride layer and the second step comprising a polysilicon dry etch to remove the exposed polysilicon. After completion of the two-step etch a poly reoxidation step is performed. The nitride spacers 510 protect the conductive layer 150 from oxidation. Otherwise the gate profile may be adversely affected by defects which result from sidewall oxidation during the poly reoxidation step. One such defect is the oxidation of the conductive layer, the barrier layer, or both. Reoxidation is important because it improves the lifetime of the device. Thus it is important that this step be included in this type of device processing. By performing the two-step dry-etch process, the nitride dry etch can stop in the polysilicon layer 230. The secondary polysilicon dry etch, which is generally more selective to oxide than a nitride dry etch, completes the gate line etch and stops at the gate oxide layer 220. An additional benefit of employing a polysilicon dry etch is that, because it has a better selectivity in oxide than a nitride dry etch, the integrity of the gate oxide layer 220 is more likely to be preserved.

Figure 6:
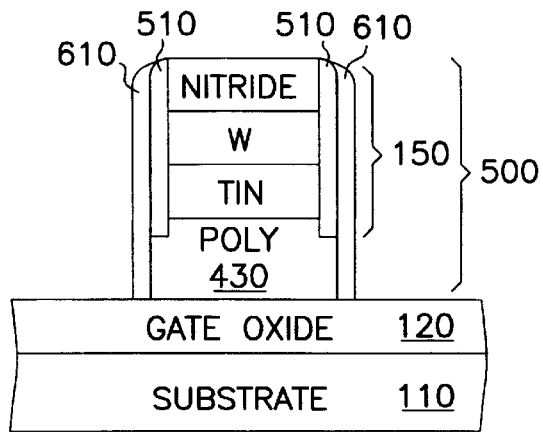
FIG. 6 is a cross-sectional view of the portion of an in-process semiconductor wafer depicted in FIG. 5, showing a second oxide barrier as fabricated according one embodiment of the present invention.

As shown in FIG. 6, in one embodiment a second spacer 610 is formed to isolate the entire gate stack 500 from other conductive layers. The second spacer 610 can be an oxide or a nitride. When oxide is used, the second spacer 610 can be formed before or after sidewall oxidation. When nitride is used, the second spacer 610 will be formed after sidewall oxidation.

Note that, by stopping the initial gate etch in the polysilicon layer 230, the nitride spacers 510 extend only to the top of the polysilicon 230. The reoxidation step is therefore able to more effectively oxidize the polysilicon gate corner 230. Conventional processing, represented in FIG. 1, creates nitride spacers the full length of the gate stack 400. As a result the reoxidation step in conventional processing must rely on the oxidant diffusing through the remaining gate oxide 110 beneath the nitride spacers 120. This can retard the desired oxidation of the polysilicon gate corner 130.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A semiconductor device comprising a plurality of gates on a gate oxide layer which has been grown on a silicon substrate, each of the plurality of gates comprising:
   a polysilicon layer adjacent to the gate oxide layer;
   a conductive layer adjacent to the polysilicon layer, wherein the conductive layer comprises a metal layer, and a metal nitride layer interposed between the metal layer and the polysilicon layer;
   sidewalls exposing the conductive layer and some portion of the polysilicon layer; and
   a first oxidation barrier on each of the gates' sidewalls, wherein the oxidation barrier covers the exposed sidewall of the conductive layer and a portion of the exposed sidewall of the polysilicon.

2. The semiconductor device of claim 1, wherein the first oxidation barrier comprises nitride.

3. The semiconductor of claim 1, further comprising a second oxidation barrier covering the entire surface of the gates' sidewalls.

4. The semiconductor device of claim 3, wherein the second oxidation barrier comprises nitride.

5. A semiconductor device comprising a plurality of gates on a gate oxide layer which has been grown on a silicon substrate, each of the plurality of gates comprising:
   a polysilicon layer adjacent to the gate oxide layer;
   a conductive layer adjacent to the polysilicon layers wherein the conductive layer comprises a metal layer, and a metal nitride layer interposed between the metal layer and the polysilicon layer;
   sidewalls exposing the conductive layer and some portion of the polysilicon layer; and
   a nitride spacer on each of the gates' sidewalls, wherein the nitride spacer covers the exposed sidewall of the conductive layer and a portion of the exposed sidewall of the polysilicon.

6. The semiconductor device of claim 5, further comprising a second spacer covering the gates' sidewalls.

7. The semiconductor device of claim 6, wherein the second spacer comprises nitride.

8. A semiconductor device comprising a plurality of gates on a gate oxide layer which has been grown on a silicon substrate, each of the plurality of gates comprising:
   a polysilicon layer adjacent to the gate oxide layer;
   a conductive layer adjacent to the polysilicon layer, wherein the conductive layer comprises layers of titanium nitride, tungsten and nitride;
   sidewalls exposing the conductive layer and some portion of the polysilicon layer; and
   a first oxidation barrier on each of the gates' sidewalls, wherein the oxidation barrier comprises nitride spacers;
   each of the gates having sidewalls exposing the conductive layer and some part of the polysilicon layer, wherein the first oxidation barrier covers the exposed sidewall of the conductive layer and a portion of the exposed sidewall of the polysilicon.

9. The semiconductor device of claim 8, further comprising a second oxidation barrier covering the entire surface of the gates' sidewalls, wherein the second oxidation barrier comprises nitride.

* * * * *

UNITED STATES PATENT AND TRADEMARK OFFICE
CERTIFICATE OF CORRECTION

PATENT NO.:5,925,918

DATED:Jul. 20, 1999

INVENTOR(S) :Wu et al.

It is certified that error appears in the above-identified patent and that said Letters Patent is hereby corrected as shown below:

In column 1, line 56, delete "WITIN" and insert --W/TiN--, therefor.

In column 3, line 38, insert --to-- after "according".

In column 6, line 13, delete "layers" and insert --layer--, therefor.

Signed and Sealed this

Sixth Day of June, 2000

*Attest:*

Q. TODD DICKINSON

*Attesting Officer*     *Director of Patents and Trademarks*